(12) United States Patent
Liu

(10) Patent No.: US 8,635,769 B2
(45) Date of Patent: Jan. 28, 2014

(54) LIGHT STRIP AND A METHOD FOR MAKING THE SAME

(75) Inventor: Chang Gui Liu, Shenzhen (CN)

(73) Assignee: Shenzhen Clear Illuninating Technology Co., Ltd., Shenzhen (CN)

( * ) Notice: Subject to any disclaimer, the term of this patent is extended or adjusted under 35 U.S.C. 154(b) by 952 days.

(21) Appl. No.: 12/621,498

(22) Filed: Nov. 19, 2009

(65) Prior Publication Data
US 2010/0214783 A1    Aug. 26, 2010

(30) Foreign Application Priority Data

Feb. 20, 2009 (CN) .......................... 2009 1 0105510
Jul. 7, 2009 (CN) .......................... 2009 1 0140274

(51) Int. Cl.
*H05K 3/34* (2006.01)
*H01R 43/00* (2006.01)
*F21S 4/00* (2006.01)

(52) U.S. Cl.
USPC .......... 29/843; 29/840; 362/249.01; 427/96.1

(58) Field of Classification Search
USPC ................... 29/825, 829, 832, 854, 840, 843; 362/249.01, 249.06, 249.14; 427/96.1, 427/96.2; 228/180
See application file for complete search history.

(56) References Cited

U.S. PATENT DOCUMENTS

| | | | | |
|---|---|---|---|---|
| 5,404,282 | A | * | 4/1995 | Klinke et al. ............. 362/249.06 |
| 5,559,681 | A | * | 9/1996 | Duarte .......................... 362/231 |
| 6,074,074 | A | * | 6/2000 | Marcus ......................... 362/240 |
| 6,641,943 | B1 | * | 11/2003 | Faris et al. .................... 429/402 |
| 7,380,961 | B2 | * | 6/2008 | Moriyama et al. ............ 362/238 |
| 7,397,529 | B1 | * | 7/2008 | Watson ......................... 349/187 |

* cited by examiner

*Primary Examiner* — Peter DungBa Vo
*Assistant Examiner* — Kaying Kue

(57) ABSTRACT

A light strip includes a conductive plate including at least two first conductive strips, at least one column second conductive strips; first electric conductors including light sources soldered at said distance between said second conductive strips, second electric conductors soldered between said first conductive strips and said second conductive strips the light strip of the present invention not only has simple structures, but also has good stability.

11 Claims, 13 Drawing Sheets

LIGHT STRIP AND A METHOD FOR MAKING THE SAME

CROSS-REFERENCE TO RELATED APPLICATION

This application claims the benefit of Chinese Application Nos. CN200910105510.4 and CN200910140274.X, filed on Feb. 20th and Jul. 7, 2009 respectively, the entire contents of which are incorporated herein by reference.

FIELD OF THE INVENTION

The present invention relates to a decorative light device, and especially to a light strip and a method for making the same.

DESCRIPTION OF RELATED ART

Plastic neon light strips are widely approved and massively used throughout the world. A traditional way for making a plastic light strip usually need firstly extrude an independent core, and then insert main power lines into the core. In addition, light strings are manufactured separately and fixed in the core commonly by manual work, and then are electrically connected to the main power lines. Moreover, a shield is defined to surround the light strip for protection. Unfortunately, the above-mentioned solution has a complicated process and can not satisfy the request of using a fully mechanized and fully automated way to make a light strip.

SUMMARY OF THE INVENTION

Accordingly, an object of the present invention is to provide a method for making a light strip which uses a fully mechanized and fully automated way. Correspondingly, the present invention also provides a light strip by such method which has a simple structure and good stability.

To achieve the object mentioned above, a method for making a light strip comprises:

offering a conductive plate;

processing said conductive plate to defining at least two first conductive strips extending longitudinally which serve as main power lines, at least one column second conductive strips which are certain distance apart one another in the longitudinal direction, and a plurality of third conductive strips retained on said conductive plate for connecting said first and second conductive strips;

soldering first electric conductors including light sources at said distance between said second conductive strips for forming light strings;

soldering second electric conductors between said first conductive strips and said second conductive strips so as to form an electrical connection between said light strings and said main power lines; and removing said third conductive strips connected between said first conductive strips and said second conductive strips.

Advantageously, said first conductors are direct insert conductors or surface-mounted-device conductors;

said second conductors are direct insert conductors or surface-mounted-device conductors.

Advantageously, before removing said third conductive strips connected between said first conductive strips and said second conductive strips, further comprising:

soldering insulative connectors between said first conductive strips and said second conductive strips for connecting and fixing said first conductive strips and said second conductive strips.

Advantageously, before removing said third conductive strips connected between said first conductive strips and said second conductive strips, further comprising:

affixing an insulative sticky tape on one surface of said conductive plate for a complete coverage before soldering said first electric conductors and said second electric conductors; or affixing insulative sticky tapes on parts of one surface of said conductive plate each of which is affixed onto said first conductive strips and said second conductive strips before soldering said first electric conductors and said second electric conductors.

Advantageously, said first electric conductors and/or said second electric conductors are direct insert conductors, said method further comprises:

after affixing said insulative sticky tape on said conductive plate, defining the first holes in said first conductive strips and said second conductive strips for receiving plugs of said conductors, and defining the second holes in said insulative sticky tape when said insulative sticky tape covering said first holes.

Advantageously, before removing said third conductive strips connected between said first conductive strips and said second conductive strips, further comprising: after soldering said first electric conductors and said second electric conductors, affixing an insulative sticky tape on one surface of said conductive plate which is opposite of the surface where said first electric conductors and said second electric conductors being soldered for a complete coverage; or after soldering said first electric conductors and said second electric conductors, affixing insulative sticky tapes on parts of one surface of said conductive plate which is the same or opposite of the surface where the first electric conductors and said second electric conductors being soldered, each of which affixed onto said first conductive strips and said second conductive strips.

Advantageously, said removing said third conductive strips connected between said first conductive strips and said second conductive strips further comprising:

retaining the third conductive strips for electrically connecting said first conductive strips and said second conductive strips on said conductive plate; and then removing other third conductive strips.

Advantageously, after removing said third conductive strips connected between said first conductive strips and said second conductive strips, further comprising:

coating a plastic insulative layer around said conductive plate through extruding molding.

Further, said processing said conductive plate includes mould punching, etching or laser machining.

Advantageously, said removing said third conductive strips connected between said first conductive strips and said second conductive strips includes mould punching, etching or laser machining.

Advantageously, said first electric conductors are selected from the group of resistors, capacitors, semiconductors and non-electronic components.

Advantageously, said second electric conductors are selected from the group of resistors, capacitors, semiconductor and non-electronic components.

The method for making light strip of the present invention, making a light strip through processing one piece of conductive plate and soldering components on which to integrate the main power lines with the light string to meet the request of fully mechanized and fully automated, and to make said light strip has a simple structure and good stability. The second electric conductors provide electrical connections between the light strings and the main power lines, as well as fix the main power lines and the light strings for ensuring the stability. In addition, according to an embodiment of the method of the present invention, the insulative connector soldered on the second electric conductor also fixes the main power lines and the light string, while it would have no adverse effect on the circuit of the light strip since the insulative connector is not conductive. Besides, according to another embodiment of the method of the present invention, the insulative sticky tape is overall covered or partially sticked onto the conductive plate, so as to fix the main power lines and the light string. Furthermore, a plastic insulative layer is formed to cover the light strip of the present invention by extruding with the exterior of the light strip, thereby providing protection to the whole light strip.

Correspondingly, the present invention still provides a method for making a light strip which comprises:

offering a conductive plate;

affixing an insulative sticky tape on one surface of said conductive plate for a complete coverage;

processing said conductive plate to defining at least two first conductive strips extending longitudinally which serve as main power lines, at least one column second conductive strips which are certain distance apart one another in the longitudinal direction;

soldering first electric conductors including light sources at said distance between said second conductive strips for forming light strings;

soldering second electric conductors between said first conductive strips and said second conductive strips so as to form an electrical connection between said light strings and said main power lines.

Advantageously, said processing said conductive plate includes etching.

The method for making light strip of the present invention, making a light strip through processing one piece of conductive plate and soldering components on which to integrate the main power lines with the light string to meet the request of fully mechanized and fully automated, and to make said light strip has a simple structure and good stability. The second electric conductors provide electrical connections between the light strings and the main power lines, as well as fix the main power lines and the light strings for ensuring the stability. In addition, the insulative sticky tape is overall covered onto the conductive plate, so as to fix the main power lines and the light string. Furthermore, a plastic insulative layer is formed to cover the light strip of the present invention by extruding with the exterior of the light strip, thereby providing protection to the whole light strip.

Correspondingly, the present invention still provides a method for making a light strip which comprises:

offering a conductive plate;

processing said conductive plate to defining at least two first conductive strips extending longitudinally which serve as main power lines, at least one column second conductive strips which are certain distance apart one another in the longitudinal direction, and a plurality of third conductive strips retained on said conductive plate for connecting said first and second conductive strips;

affixing an insulative sticky tape on one surface of said conductive plate for a complete coverage, or, affixing insulative sticky tapes on parts of one surface of said conductive plate each of which is affixed onto said first conductive strips and said second conductive strips;

removing said third conductive strips connected between said first conductive strips and said second conductive strips;

soldering first electric conductors including light sources at said distance between said second conductive strips for forming light strings;

soldering second electric conductors between said first conductive strips and said second conductive strips so as to form an electrical connection between said light strings and said main power lines.

The method for making light strip of the present invention, making a light strip through processing one piece of conductive plate and soldering components on which to integrate the main power lines with the light string to meet the request of fully mechanized and fully automated, and to make said light strip has a simple structure and good stability. The second electric conductors provide electrical connections between the light strings and the main power lines, as well as fix the main power lines and the light strings for ensuring the stability. In addition, according to an embodiment of the method of the present invention, the insulative sticky tape is overall covered or partially sticked onto the conductive plate, so as to fix the main power lines and the light string. Furthermore, a plastic insulative layer is formed to cover the light strip of the present invention by extruding with the exterior of the light strip, thereby providing protection to the whole light strip.

Correspondingly, a light strip of prevent invention comprising:

a conductive plate including at least two first conductive strips extending longitudinally which serve as main power lines, at least one column second conductive strips which are certain distance apart one another in the longitudinal direction;

first electric conductors including light sources soldered at said distance between said second conductive strips for forming light strings, second electric conductors soldered between said first conductive strips and said second conductive strips so as to forming an electrical connection between said light strings and said main power lines.

Advantageously, said first conductors are direct insert conductors or surface-mounted-device conductors;

said second conductors are direct insert conductors or surface-mounted-device conductors.

Advantageously, said light strip further comprising:

insulative connectors soldered between said first conductive strips and said second conductive strips for connecting and fixing said first conductive strips and said second conductive strips.

Advantageously, said light strip further comprising:

insulative sticky tape affixed on one surface which is opposite of the surface where said first electric conductors and said second electric conductors being soldered.

Advantageously, said light strip further comprising:

insulative sticky tape affixed on parts of one surface of said conductive plate which is the same or opposite of the surface where the first electric conductors and said second electric conductors being soldered, each of which affixed onto said first conductive strips and said second conductive strips.

Advantageously, said light strip further comprising:

holes set on said first conductive strips, said second conductive strips, and said insulative sticky tape used for receiving the plugs of said conductors.

Advantageously, said light strip further comprising:

a plastic insulative layer coated outside said conductive plate.

Advantageously, said first electric conductors are selected from the group of resistors, capacitors, semiconductors and non-electronic components.

Advantageously, said second electric conductors are selected from the group of resistors, capacitors, semiconductors and non-electronic components.

The light strip of the present invention is made through processing one piece of conductive plate and soldering components on which to integrate the main power lines with the light string, which has a simple structure and good stability. The second electric conductors provide electrical connections between the light string and the main power lines, as well as fix the main power lines and the light strings for ensuring the stability. In addition, according to an embodiment of the light strip of the present invention, the insulative connector soldered on the second electric conductor also fixes the main power lines and the light string, while it would have no adverse effect on the circuit of the light strip since the insulative connector is not conductive. Besides, according to another embodiment of the light strip of the present invention, the insulative sticky tape is overall covered or partially sticked onto the conductive plate, so as to fix the main power lines and the light string. Furthermore, a plastic insulative layer is formed to cover the light strip of the present invention by extruding with the exterior of the light strip, thereby providing protection to the whole light strip.

Other objects, advantages and novel features of the invention will become more apparent from the following detailed description when taken in conjunction with the accompanying drawings.

DETAILED DESCRIPTION OF THE PREFERRED EMBODIMENTS

Figure 1:
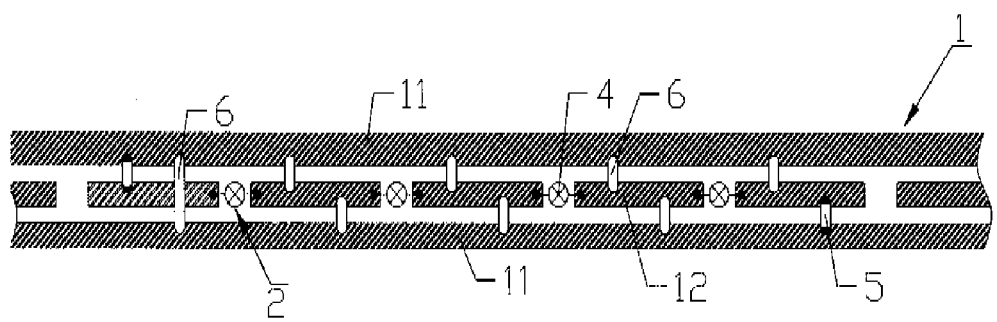
FIG. 1 is a perspective view of an embodiment of the light strip of the present invention.

Referring to FIG. 1, an embodiment of the light strip of the present invention includes a conductive plate 1, which includes two first conductive strips 11 and a plurality of second conductive strips 12, said first conductive strips 11 serve as main power lines of said light strip, each of said first conductive strips 11 extends longitudinally, and said second conductive strips 12 are certain distance apart one another in the longitudinal direction. As an example, said conductive plate could be a conductive metal plate.

A plurality of first electric conductors 4 are soldered at the distance between said second conductive strips 12 for forming light strings 2. Advantageously, said first electric conductors 4 include various light sources such as resistors, capacitors, semiconductors and non-electronic components. In addition, said first electric conductors 4 are direct insert conductors or surface-mounted-device conductors, said light sources include light emitting diode (LED) which here could be direct plug-in LED, surface-mounted-device LED, printed circuit boards with surface-mounted-device LED, or printed circuit boards with LED crystal plates.

A plurality of second electric conductors 5 are soldered between said first conductive strips 11 and said second conductive strips 12. In this embodiment, said second electric conductors 5 provide electrical connections between the light strings and the main power lines, as well as fix the main power lines and the light strings for ensuring the stability. Besides, said second electric conductors 5 are direct insert conductors or surface-mounted-device conductors such as resistors, capacitors, semiconductors and non-electronic components.

In addition, holes (not shown in FIG. 1) are set on said first conductive strips 11 and said second conductive strips 12 for receiving the plugs of said first electric conductors 4 and/or said second electric conductors 5 when said first electric conductors 4 and said second electric conductors 5 are direct insert conductors.

Insulative connectors 6 are soldered between said first conductive strips 11 and said second conductive strips 12 to connect and fix said first conductive strips 11 and said second conductive strips 12. Advantageously, each of said insulative connectors 6 is soldered synchronously on the first conductive strips 11 and said second conductive strips 12 adjacent to each other, or which is soldered synchronously on all said first conductive strips 11 and said second conductive strips 12 located at the same plane.

In addition, a plastic insulative layer is coated around said light strings through extruding molding so as to protect said light strings.

The light strip of the present invention is made through processing one piece of conductive plate and soldering components on which to integrate the main power lines with the light string, which has a simple structure and good stability. The second electric conductors provide electrical connections between the light string and the main power lines, as well as fix the main power lines and the light strings for ensuring the stability. In addition, the insulative connector soldered on the second electric conductor also fixes the main power lines and the light string, while it would have no adverse effect on the circuit of the light strip since the insulative connector is not conductive. Besides, a plastic insulative layer is formed to cover the light strip of the present invention by extruding with the exterior of the light strip, thereby providing protection to the whole light strip.

Figure 2:
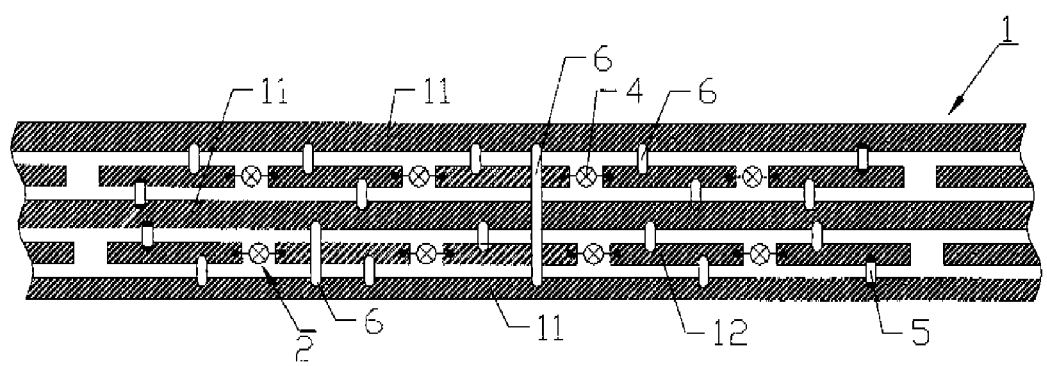
FIG. 2 is a perspective view of another embodiment of the light strip of the present invention.

Another embodiment of the light strip of the present invention is shown in FIG. 2.

With reference to FIG. 2, the light strip provided in this embodiment includes a conductive plate 1, which includes three first conductive strips 11 extending longitudinally which serve as main power lines, two columns second conductive strips 12 which are arranged on the interval of every two first conductive strips 11 adjacent to each other and are certain distance apart one another in the longitudinal direction.

A plurality of first electric conductors 4 are soldered at the distance between said second conductive strips 12 for forming light strings 2. Advantageously, said first electric conductors 4 include light sources such as prerequisite, resistors, capacitors, semiconductors and non-electronic components. In addition, said first electric conductors 4 are direct insert conductors or surface-mounted-device conductors, said light sources include light emitting diode (LED) which here could be direct plug-in LED, surface-mounted-device LED, printed circuit boards with surface-mounted-device LED, or printed circuit boards with LED crystal plates.

At least one column second electric conductors 5 are soldered between said first conductive strips 11 and said second conductive strips 12. In this embodiment, said second electric conductors 5 provide electrical connections between the light strings and the main power lines, as well as fix the main power lines and the light strings for ensuring the stability. Besides, said second electric conductors 5 are direct insert conductors or surface-mounted-device conductors, which include resistors, capacitors, semiconductors and non-electronic components.

Insulative connectors 6 are soldered synchronously on said first conductive strips 11 and said second conductive strips 12 to connect and fix said first conductive strips 11 and said second conductive strips 12. Advantageously, each of said insulative connectors 6 is soldered synchronously on the first conductive strips 11 and said second conductive strips 12 adjacent to each other or soldered synchronously on two first conductive strips 11 adjacent to each other as well as on the second conductive strips 12 between said two first conductive strips 11 or soldered synchronously on all said first conductive strips 11 and said second conductive strips 12 located at the same plane.

The light strip of the present invention is made through processing one piece of conductive plate and soldering components on which to integrate the main power lines with the light string, which has a simple structure and good stability. The second electric conductors provide electrical connections between the light string and the main power lines, as well as fix the main power lines and the light strings for ensuring the stability. In addition, the insulative connector soldered on the second electric conductor also fixes the main power lines and the light string, while it would have no adverse effect on the circuit of the light strip since the insulative connector is not conductive.

Figure 3:
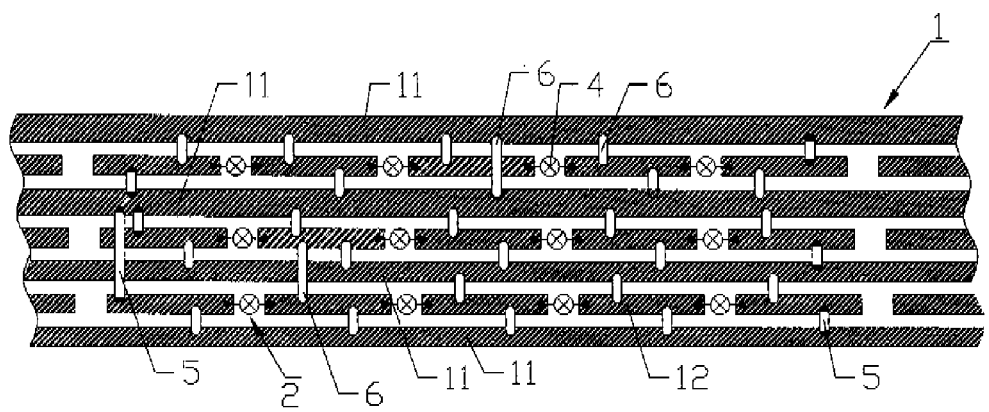
FIG. 3 is a perspective view of another embodiment of the light strip of the present invention.

Still another embodiment of the light strip of the present invention is shown in FIG. 3.

With reference to FIG. 3, the structure of the light strip provided in this embodiment is almost the same as which in the second embodiment except four main power lines 11 and three light strings 2 are provided in this embodiment. Please reference to FIG. 3 for details. In this, will not describe in more details.

Figure 4:
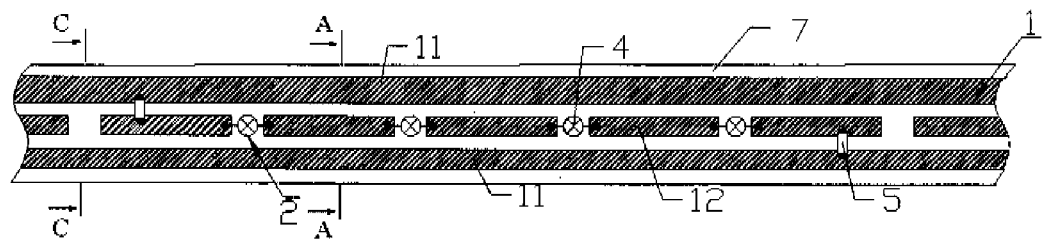
FIG. 4 is a perspective view of another embodiment of the light strip of the present invention.

Still another embodiment of the light strip of the present invention is shown in FIG. 4.

Figure 5:
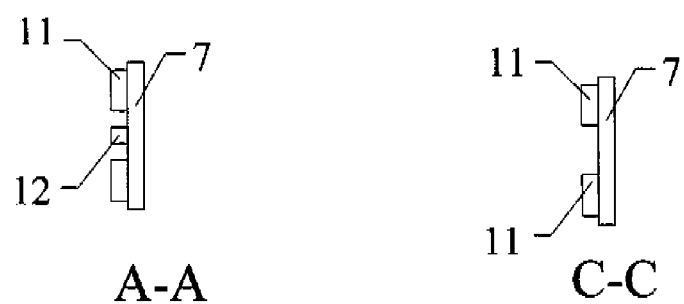
FIG. 5 is a cross sectional view showing the A-A section and the C-C section of the light strip shown in FIG. 6.

With reference to FIG. 4 and FIG. 5, this embodiment shows a light strip which includes two main power lines and one light strings. The differences between this embodiment and the embodiment shown in FIG. 1 is there is an insulative sticky tape 7 affixed on one surface of a conductive plate 1 which is opposite of the surface where the first electric conductors 11 and the second electric conductors 12 are soldered for a complete coverage, so as to fix the main power lines and the light string. Advantageously, said insulative sticky tape 7 could be a plastic tape. Please reference to FIG. 4 for details. In this, will not describe in more details. To say more, when said first electric conductors 4 and/or said second electric conductors 5 are surface-mounted-device conductors, said insulative sticky tape 7 should be affixed on one surface of said conductive plate 1 which is opposite to the surface where the first electric conductors 11 and the second electric conductors 12 are soldered; otherwise, when said first electric conductors 4 and/or said second electric conductors 5 are direct insert conductors, said insulative sticky tape 7 could be affixed on the surface which is the same or opposite surface where the first electric conductors 11 and the second electric conductors 12 are soldered.

Further, if said first electric conductors 4 and said second electric conductors 5 are direct insert conductors, holes used for receiving the plugs of said conductors should be set on said first conductive strips 11 and said second conductive strips 12.

Moreover, there are still holes set on said insulative sticky tape 7 if said insulative sticky tape 7 covers the holes set on said first conductive strips 11 and said second conductive strips 12.

The insulative sticky tape 7 provided in this embodiment can be re-use cause which is still sticky when removed from said conductive plate 1.

The light strip of the present invention, is made through processing one piece of conductive plate and soldering components on which to integrate the main power lines with the light string, which has a simple structure and good stability. The second electric conductors provide electrical connections between the light string and the main power lines, as well as fix the main power lines and the light strings for ensuring the stability. In addition, the insulative sticky tape is overall covered onto the conductive plate, so as to fix the main power lines and the light string.

Figure 6:
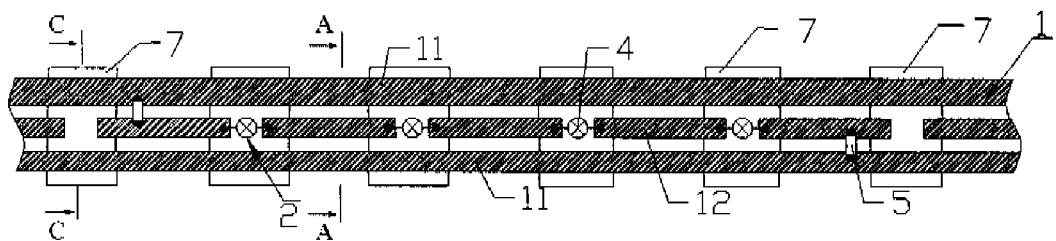
FIG. 6 is a perspective view of another embodiment of the light strip of the present invention.

Still another embodiment of the light strip of the present invention is shown in FIG. 6.

With reference to FIG. 6, this embodiment shows a light strip which includes two main power lines and one light string. The differences between this embodiment and the embodiment which shown in FIG. 1 is there are insulative sticky tape 7 affixed on parts of one surface of a conductive plate 1 which is opposite of the surface where the first electric conductors 11 and the second electric conductors 12 are soldered, specifically, each of said insulative sticky tape 7 is affixed on said first conductive strips 11 and said second conductive strips 12 for fixing the main power lines and said light strings.

Figure 7:
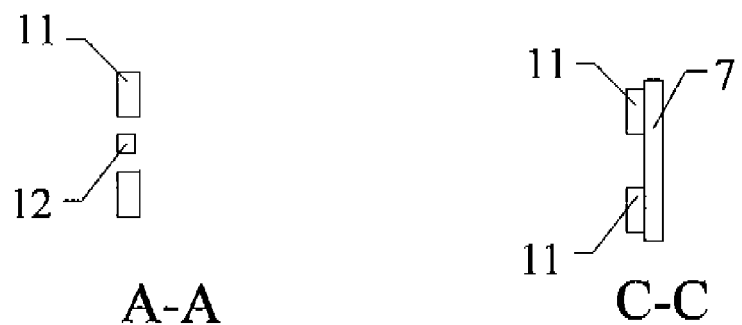
FIG. 7 is a cross sectional view showing the A-A section and the C-C section of the light strip shown in FIG. 6.

Further, with reference to the A-A section view and the C-C section view shown in FIG. 7, there is only one layer when there is no insulative sticky tape 7 affixed on the conductive plate 1, while there are two layers if insulative sticky tapes 7 are affixed on said conductive plate 1.

To say more, each of said insulative sticky tapes 7 could be affixed on the surface which is the same or opposite to the surface where the first electric conductors 11 and the second electric conductors 12 are soldered.

Further, if said first electric conductors 4 and said second electric conductors 5 are direct insert conductors, holes used for receiving the plugs of said conductors should be set on said first conductive strips 11 and said second conductive strips 12.

Correspondingly, the invention also provides the method for making light strip disclosed above.

FIGS. 8 to 11 are shown the first embodiment of the method for making the light strip.

Figure 8:
FIG. 8 is a perspective view of a conductive plate of the first embodiment of the manufacture method of the light strip before processed.
Figure 9:
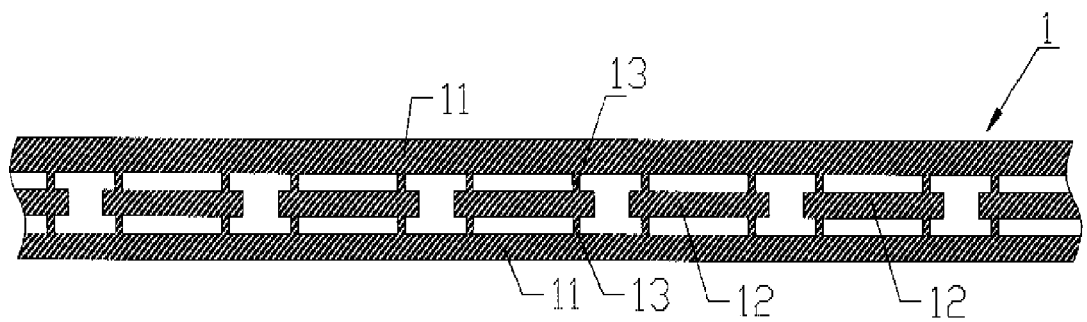
FIG. 9 is a perspective view of the conductive plate shown in FIG. 8 after processed.

With reference to FIGS. 8 to 11, this embodiment discloses how to make a light strip including two main power lines and one light strings. Specifically, the method comprises:

Firstly, referring to FIG. 8, offering a conductive plate 1;

Further, referring to FIG. 9, processing said conductive plate 1 to defining two first conductive strips 11 extending longitudinally which serve as main power lines, one column second conductive strips 12 which are certain distance apart one another in the longitudinal direction, and a plurality of third conductive strips 13 which retained on said conductive plate 1 for connecting said first and second conductive strips. Advantageously, the method for processing said conductive plate 1 includes mould punching, etching or laser machining.

Figure 10:
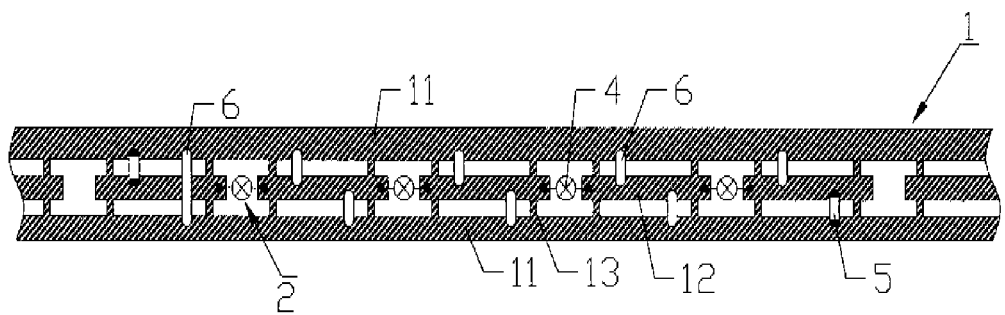
FIG. 10 is a perspective view of the conductive plate shown in FIG. 9 after soldered electronic conductors.

Further, referring to FIG. 10, soldering first electric conductors 4 at said distance between said second conductive strips 12 for forming light strings. As well as, soldering second electric conductors 5 between said first conductive strips 11 and said second conductive strips 12 so as to forming the electrical connection between said light strings and said main power lines. Advantageously, said first electric conductors 4 include light sources which are prerequisite, resistors, capacitors, semiconductors and non-electronic components. In addition, said first electric conductors 4 are direct insert conductors or surface-mounted-device conductors, said light sources include light emitting diode (LED) which here could be direct plug-in LED surface-mounted-device LED, printed circuit boards with surface-mounted-device LED, or printed circuit boards with LED crystal plates. In addition, said second electric conductors 5 are direct insert conductors or surface-mounted-device conductors, which include resistors, capacitors, semiconductors and non-electronic components.

In addition, set holes (which not shown in FIG. 10) on said first conductive strips 11 and said second conductive strips 12 for receiving the plugs of said first electric conductors 4 and/or said second electric conductors 5 when said first electric conductors 4 and said second electric conductors 5 are direct insert conductors.

Still referring to FIG. 10, the method further includes soldering insulative connectors 6 between said first conductive strips 11 and said second conductive strips 12 to connect and fix said first conductive strips 11 and said second conductive strips 12. Advantageously, each of said insulative connectors 6 is soldered synchronously on the first conductive strips 11 and said second conductive strips 12 adjacent to each other, or which is soldered synchronously on all said first conductive strips 11 and said second conductive strips 12 located at the same plane.

Figure 11:
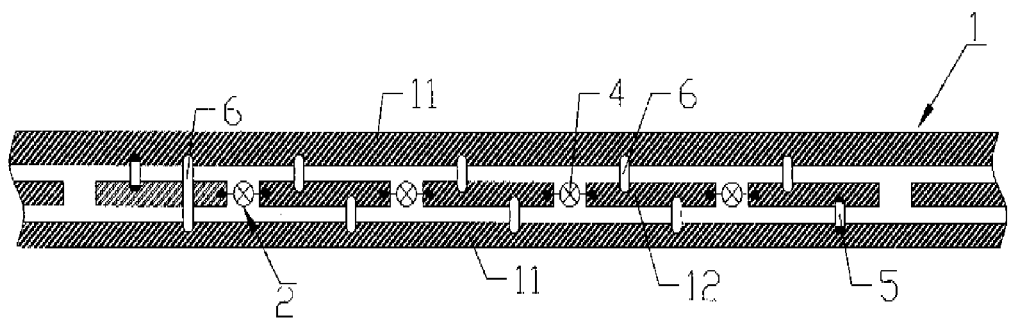
FIG. 11 is a perspective view of the conductive plate shown in FIG. 10 after removing the third conductive strips.

Further, referring to FIG. 11, after soldering all the components (includes said first electric conductors 4 and said second electric conductors 5), removing said third conductive strips 13 connected between said first conductive strips 11 and said second conductive strips 12. Advantageously, the step that removing said third conductive strips connected between said first conductive strips and said second conductive strips comprises retaining the third conductive strips for electrically connecting said first conductive strips and said second conductive strips on said conductive palte; and then removing other third conductive strips. Advantageously, said removing said third conductive strips connected between said first conductive strips and said second conductive strips includes mould punching, etching or laser machining.

Further, after removing said third conductive strips connected between said first conductive strips and said second conductive strips, the method further comprises: coating a plastic insulative layer around said conductive plate through extruding molding.

The method for making light strip the present invention, making a light strip through processing one piece of conductive plate and soldering components on which to integrate the main power lines with the light string to meet the request of fully mechanized and fully automated, and to make said light strip has a simple structure and good stability. The second electric conductors provide electrical connections between the light strings and the main power lines, as well as fix the main power lines and the light strings for ensuring the stability. In addition, the insulative connector soldered on the second electric conductor also fixes the main power lines and the light string, while it would have no adverse effect on the circuit of the light strip since the insulative connector is not conductive. Furthermore, a plastic insulative layer is formed to cover the light strip of the present invention by extruding with the exterior of the light strip, thereby providing protection to the whole light strip.

FIGS. 12 to 15 are shown the second embodiment of the method for making the light strip.

Figure 12:
FIG. 12 is a perspective view of a conductive plate of the second embodiment of the manufacture method of the light strip before processed.
Figure 13:
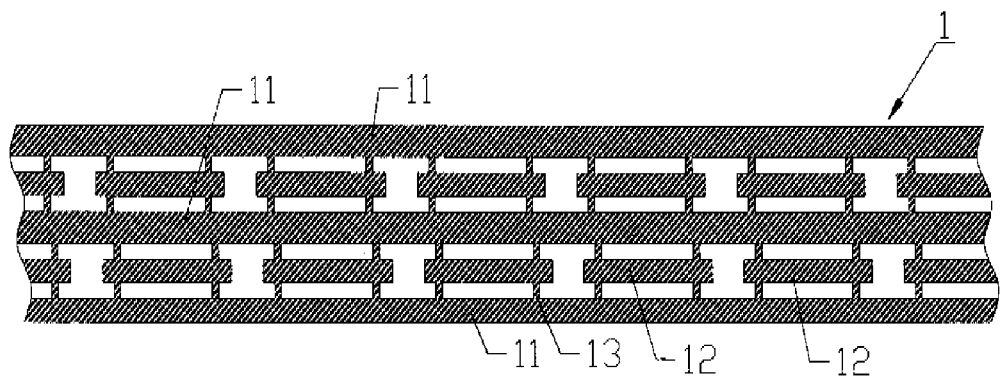
FIG. 13 is a perspective view of the conductive plate shown in FIG. 12 after processed.

With reference to FIGS. 12 to 15, this embodiment discloses how to make a light strip which includes three main power lines and two light strings. Specifically, the method comprising:

First, referring to FIG. 12, offering a conductive plate 1;

Further, referring to FIG. 13, processing said conductive plate 1 to defining three first conductive strips 11 extending longitudinally which serve as main power lines, two columns second conductive strips 12 which are arranged on the interval of every two first conductive strips 11 adjacent to each other and are certain distance apart one another in the longitudinal direction, and a plurality of third conductive strips 13 retained on said conductive plate for connecting said first and second conductive strips Advantageously, the method for processing said conductive plate 1 includes mould punching, etching or laser machining.

Figure 14:
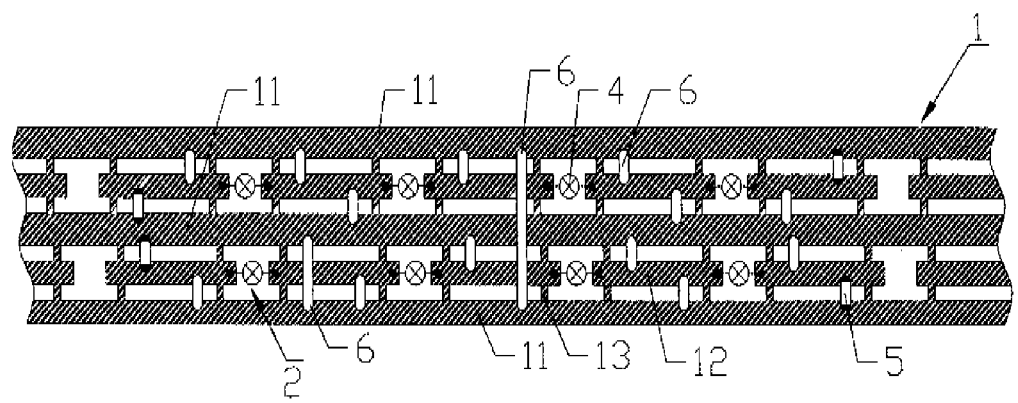
FIG. 14 is a perspective view of the conductive plate shown in FIG. 9 after soldered electronic conductors.

Further, referring to FIG. 14, soldering first electric conductors 4 at said distance between said second conductive strips 12 for forming light strings. As well as, soldering second electric conductors 5 between said first conductive strips 11 and said second conductive strips 12 so as to forming the electrical connection between said light strings and said main power lines. Advantageously, said first electric conductors 4 include light sources which are prerequisite, resistors, capacitors, semiconductors and non-electronic components. In addition, said first electric conductors 4 are direct insert conductors or surface-mounted-device conductors, said light sources include light emitting diode (LED) which here could be direct plug-in LED, surface-mounted-device LED, printed circuit boards with surface-mounted-device LED, or printed circuit boards with LED crystal plates. In addition, said second electric conductors 5 are direct insert conductors or surface-mounted-device conductors, which include resistors, capacitors, semiconductors and non-electronic components.

In addition, set holes (which not shown in FIG. 14) on said first conductive strips 11 and said second conductive strips 12 for receiving the plugs of said first electric conductors 4 and/or said second electric conductors 5 when said first electric conductors 4 and said second electric conductors 5 are direct insert conductors.

Still referring to FIG. 14, the method further includes soldering insulative connectors 6 between said first conductive strips 11 and said second conductive strips 12 to connect and fix said first conductive strips 11 and said second conductive strips 12. Advantageously, each of said insulative connectors 6 is soldered synchronously on the first conductive strips 11 and said second conductive strips 12 adjacent to each other or soldered synchronously on two first conductive strips 11 adjacent to each other as well as on the second conductive strips 12 between said two first conductive strips 11 or soldered synchronously on all said first conductive strips 11 and said second conductive strips 12 located at the same plane.

Figure 15:
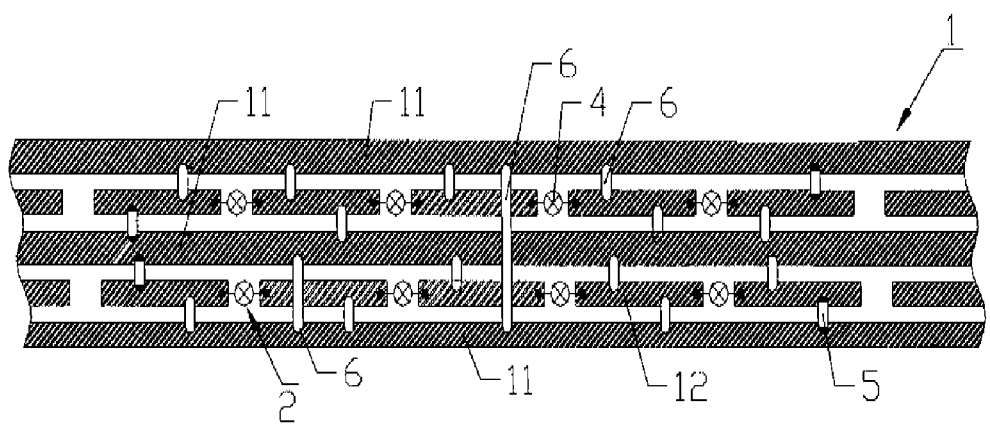
FIG. 15 is a perspective view of the conductive plate shown in FIG. 14 after removing the third conductive strips.
Figure 16:
FIG. 16 is a perspective view of a conductive plate of the third embodiment of the manufacture method of the light strip before processed.
Figure 17:
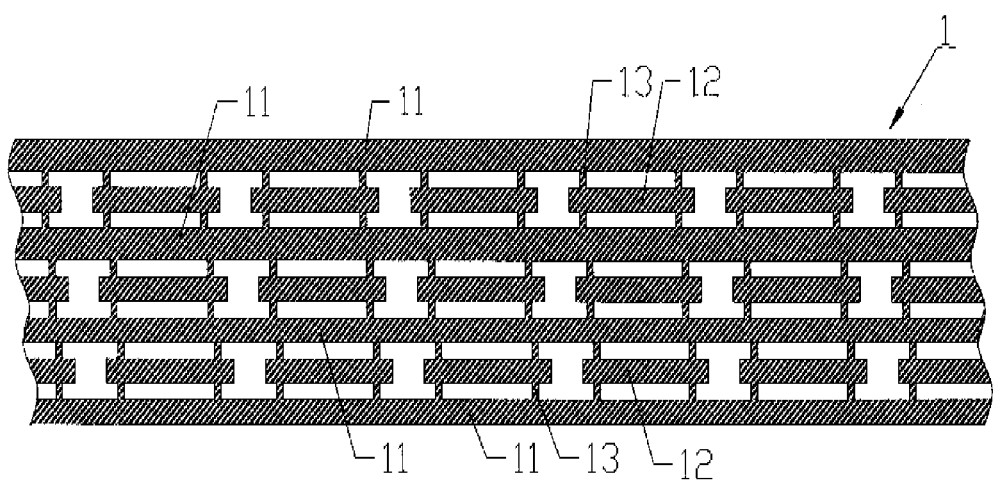
FIG. 17 is a perspective view of the conductive plate shown in FIG. 16 after processed.
Figure 18:
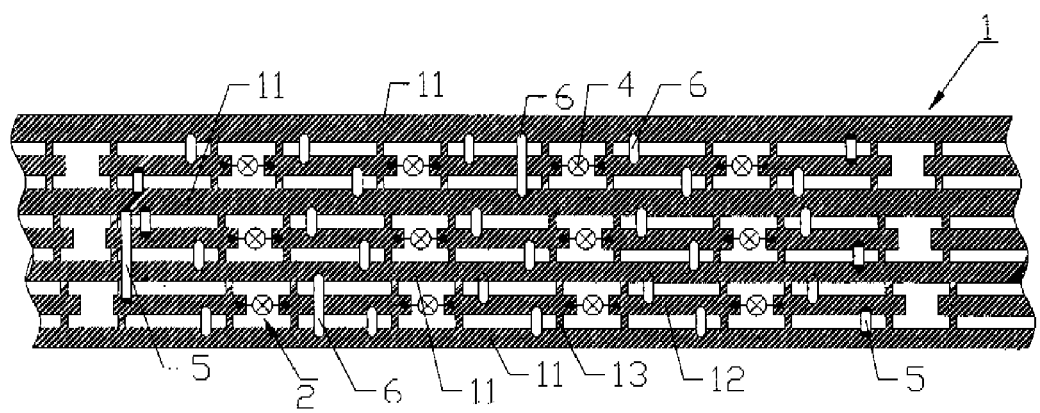
FIG. 18 is a perspective view of the conductive plate shown in FIG. 17 after soldered with electronic conductors.
Figure 19:
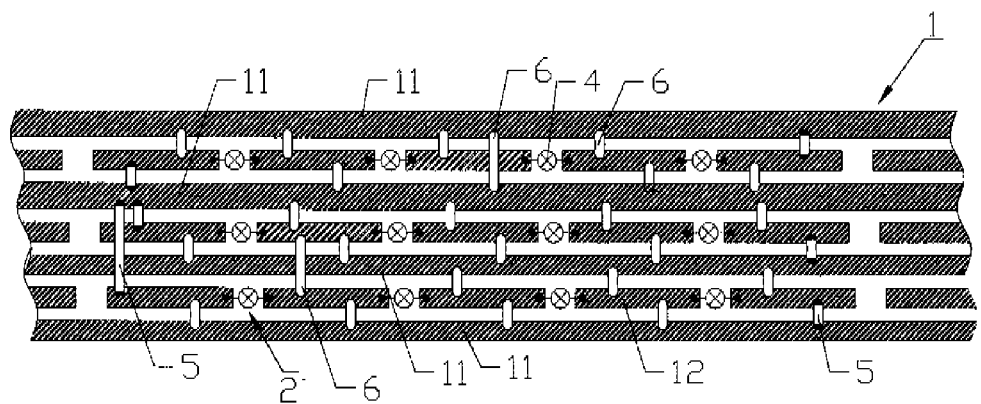
FIG. 19 is a perspective view of the conductive plate shown in FIG. 18 after removing the third conductive strips.

Further, referring to FIG. 15, after soldering all the components (includes said first electric conductors 4 and said second electric conductors 5), removing said third conductive strips 13 connected between said first conductive strips 11 and said second conductive strips 12. Advantageously, the step that removing said third conductive strips connected between said first conductive strips and said second conductive strips comprises retaining the third conductive strips for electrically connecting said first conductive strips and said second conductive strips on said conductive plate; and then removing other third conductive strips.

Further, after removing said third conductive strips connected between said first conductive strips and said second conductive strips, further comprising: coating a plastic insulative layer around said conductive plate through extruding molding.

The method for making light strip the present invention, making a light strip through processing one piece of conductive plate and soldering components on which to integrate the main power lines with the light string to meet the request of fully mechanized and fully automated, and to make said light strip has a simple structure and good stability. The second electric conductors provide electrical connections between the light strings and the main power lines, as well as fix the main power lines and the light strings for ensuring the stability. In addition, the insulative connector soldered on the second electric conductor also fixes the main power lines and the light string, while it would have no adverse effect on the circuit of the light strip since the insulative connector, is not conductive. Furthermore, a plastic insulative layer is formed to cover the light strip of the present invention by extruding with the exterior of the light strip, thereby providing protection to the whole light strip.

FIGS. 16 to 19 are shown the third embodiment of the method for making the light strip.

With reference to FIGS. 16 to 19, this embodiment disclose how to make a light strip includes four main power lines and three light strings. Specifically, the method are almost the same as the second embodiment, the difference between these three embodiments is the number of the main power lines and the light strings, Please reference to FIGS. 16 to 19 for details of the steps of this embodiment. In this, will not describe in more details.

FIGS. 20 to 25 are shown the fourth embodiment of the method for making the light strip.

Figure 20:
FIG. 20 is a perspective view of a conductive plate of the fourth embodiment of the manufacture method of the light strip before processed.
Figure 21:
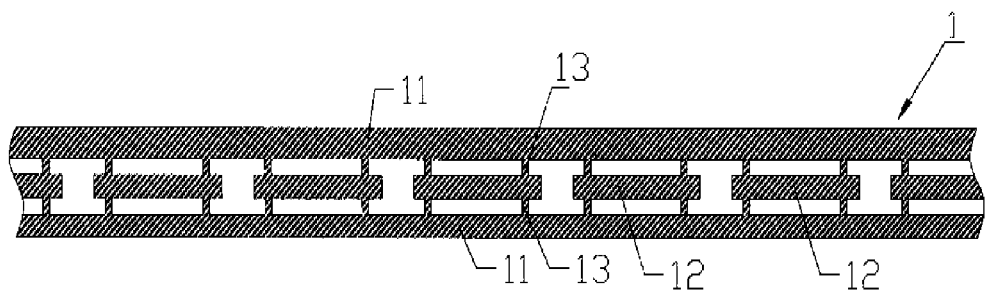
FIG. 21 is a perspective view of the conductive plate shown in FIG. 20 after processed.
Figure 22:
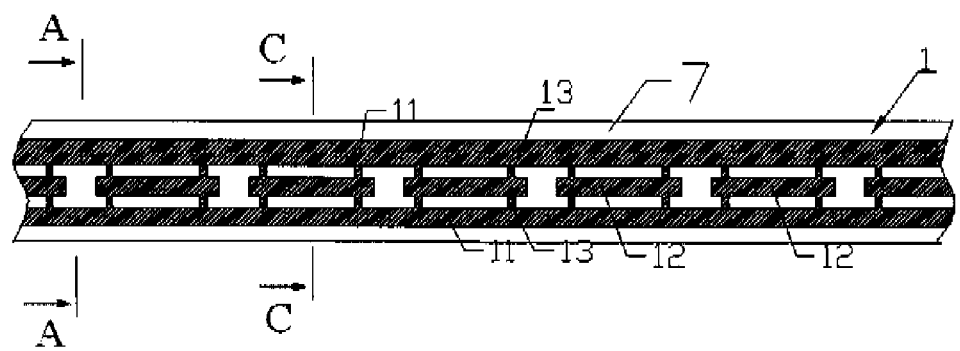
FIG. 22 is a perspective view of the conductive plate shown in FIG. 21 after affixed insulative sticky tape which full covering the conductive plate.

With reference to FIGS. 20 to 25, this embodiment disclose how to make a light strip including two main power lines and one light strings. Specifically, the method comprising:

First, referring to FIG. 20, offering a conductive plate 1;

Further, referring to FIG. 21, processing the conductive plate 1 to defining two first conductive strips 11 extending longitudinally which serve as main power lines, one column second conductive strips 12 which are certain distance apart one another in the longitudinal direction, and a plurality of third conductive strips 13 which retained on said conductive plate 1 for connecting said first and second conductive strips. Advantageously, the method for processing said conductive plate 1 includes mould punching, etching or laser machining Further, after processing said conductive plate 1, affixing insulative sticky tape 7 on one surface of said conductive plate 1 for a complete coverage. Advantageously, said insulative sticky tape 7 could be a plastic tape.

Figure 23:
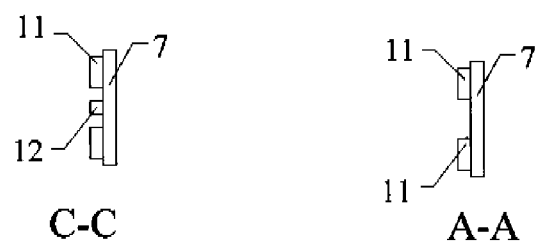
FIG. 23 is a cross sectional view which showing the A-A section and the C-C section of the light strip shown in FIG. 22.

Further, with reference to the A-A section view and the C-C section view shown in FIG. 23, there are two layers look through said A-A and C-C section if said conductive plate 1 affixed with said insulative sticky tape 7, and said insulative sticky tape 7 is clung close to said conductive plate 1. Advantageously, the thickness of said conductive plate 1 and said insulative sticky tape 7 could be very thin, fox example, the thickness of said insulative sticky tape 7 is equal to a paper.

Figure 24:
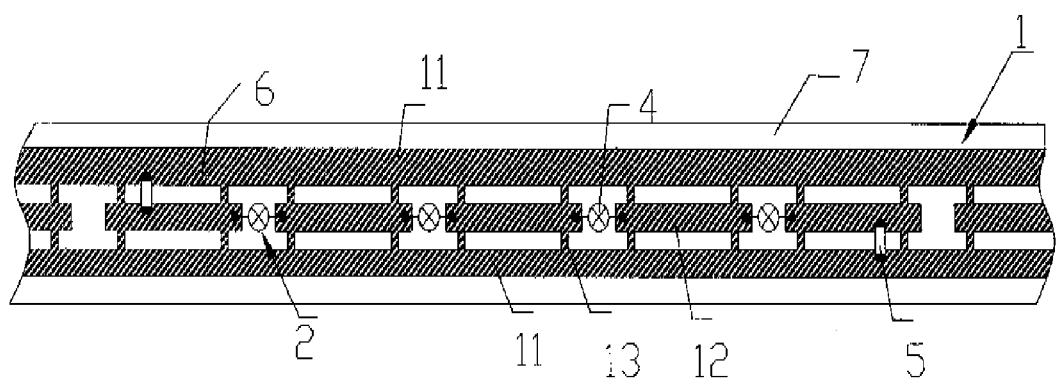
FIG. 24 is a perspective view of the conductive plate shown in FIG. 22 after soldered electronic conductors.

Further, referring to FIG. 24, soldering first electric conductors 4 at said distance between said second conductive strips 12 for forming light strings, as well as, soldering second electric conductors 5 between said first conductive strips 11 and said second conductive strips 12 so as to forming the electrical connection between said light strings and said main power lines. Advantageously, said first electric conductors 4 include light sources which are prerequisite, resistors, capacitors, semiconductors and non-electronic components. In addition, said first electric conductors 4 are direct insert conductors or surface-mounted-device conductors, said light sources include light emitting diode (LED) which here could be direct plug-in LED, surface-mounted-device LED, printed circuit boards with surface-mounted-device LED, or printed circuit boards with LED crystal plates. In addition, said second electric conductors 5 are direct insert conductors or surface-mounted-device conductors, which include resistors, capacitors semiconductors and non-electronic components.

In addition, set holes (which not shown in FIG. 24) on said first conductive strips 11 and said second conductive strips 12 and said insulative sticky tape 7 for receiving the plugs of said first electric conductors 4 and/or said second electric conductors 5 when said first electric conductors 4 and said second electric conductors 5 are direct insert conductors.

In this embodiment, said insulative sticky tape 7 are affixed to said conductive plate 1 before the components (includes said first electric conductors 4 and said second electric conductors 5) are soldered to said conductive plate 1. Besides said insulative sticky tape 7 could be affixed to said conductive plate 1 after said components (includes said first electric conductors 4 and said second electric conductors 5) are soldered to said conductive plate 1, that is, the operation order of the steps shown in FIG. 22 and FIG. 24 can be exchanged, in that situation, when said first electric conductors 4 and/or said second electric conductors 5 are surface-mounted-device conductors, said insulative sticky tape 7 should be affixed on one surface of said conductive plate 1 which is opposite to the surface where the first electric conductors 11 and the second electric conductors 12 are soldered; otherwise, when said first electric conductors 4 and/or said second electric conductors 5 are direct insert conductors, said insulative sticky tape 7 could be affixed on the surface which is the same or opposite surface where the first electric conductors 11 and the second electric conductors 12 are soldered.

Figure 25:
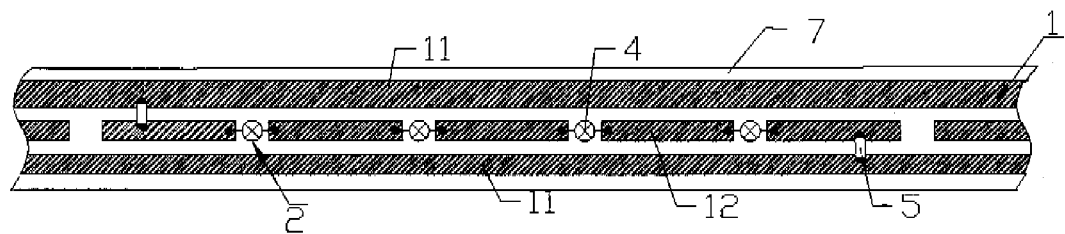
FIG. 25 is a perspective view of the conductive plate shown in FIG. 24 after removing the third conductive strips.
Figure 26:
FIG. 26 is a perspective view of a conductive plate of the fifth embodiment of the manufacture method of the light strip before processed.
Figure 27:
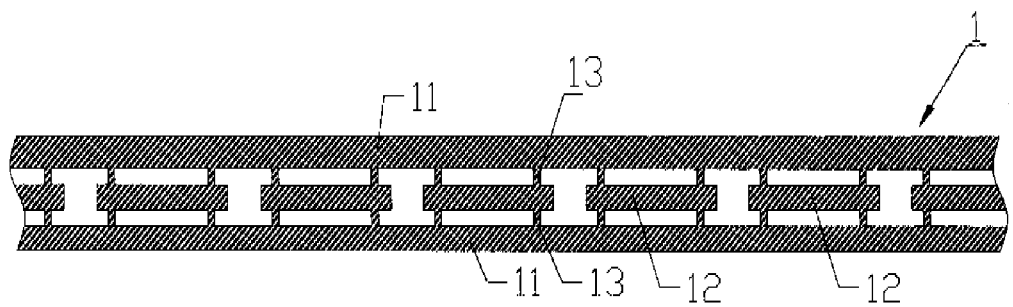
FIG. 27 is a perspective view of the conductive plate shown in FIG. 26 after processed.

Further, referring to FIG. 25, after soldering all the components (includes said first electric conductors 4 and said second electric conductors 5), removing said third conductive strips 13 connected between said first conductive strips 11 and said second conductive strips 12. Advantageously, the step that removing said third conductive strips connected between said first conductive strips and said second conductive strips comprises retaining the third conductive strips for electrically connecting said first conductive strips and said second conductive strips on said conductive palte; and then removing other third conductive strips.

The method for making light strip of the present invention, making a light strip through processing one piece of conductive plate and soldering components on which to integrate the main power lines with the light string to meet the request of fully mechanized and fully automated, and to make said light strip has a simple structure and good stability. The second electric conductors provide electrical connections between the light strings and the main power lines, as well as fix the main power lines and the light strings for ensuring the stability. In addition, the insulative sticky tape is overall covered onto the conductive plate, so as to fix the main power lines and the light string.

FIGS. 26 to 30 are shown the fifth embodiment of the method for making light strip.

Figure 28:
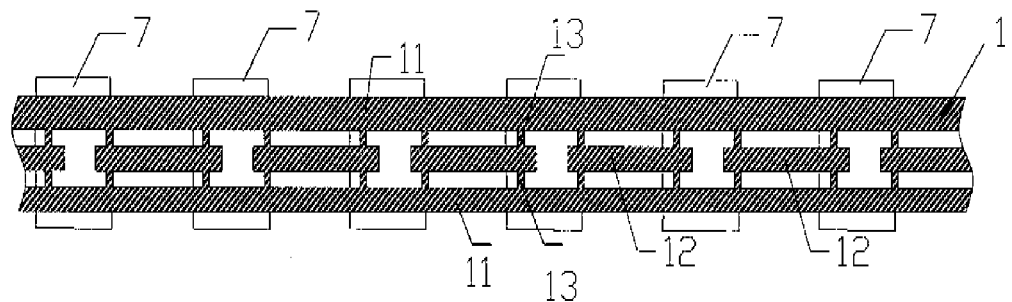
FIG. 28 is a perspective view of the conductive plate shown in FIG. 27 after affixed insulative sticky tape which covers parts of the conductive plate.

With reference to FIGS. 26 to 30, this embodiment disclose how to make a light strip including two main power lines and one light strings. The difference between this embodiment and the fourth embodiment is that the insulative sticky tape 7 of this embodiment only covering parts of the conductive plate 1. Specifically, said insulative sticky tape 7 is affixed synchronously on the first conductive strips 11 and the second conductive strips 12 for fixing said first conductive strips 11 and said second conductive strips 12. For example, as shown in FIG. 28, each of said insulative sticky tape 7 is affixed synchronously on two of said second conductive strips 12 and also affixed on said first conductive strips 11 which located the two sides of said two second conductive strips 12.

Figure 29:
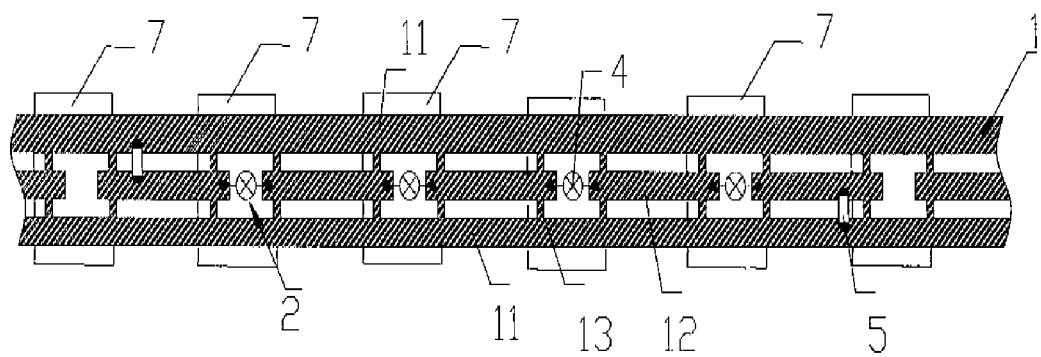
FIG. 29 is a perspective view of the conductive plate shown in FIG. 28 after soldered electronic conductors.
Figure 30:
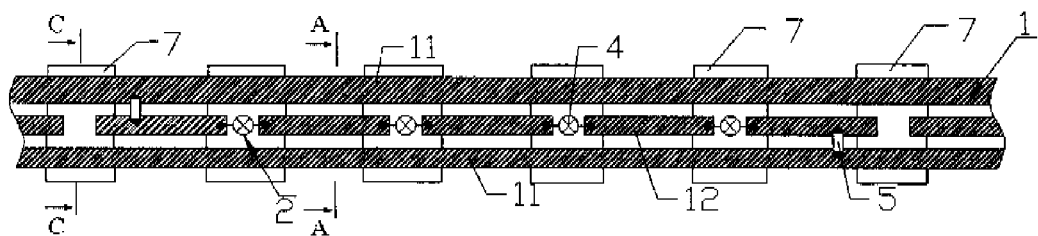
FIG. 30 is a perspective view of the conductive plate shown in FIG. 29 after removing the third conductive strips.

Correspondingly, in this embodiment, said insulative sticky tape 7 affixed to the conductive plate 1 before the components (includes the first electric conductors 4 and the second electric conductors 5) is soldered to the conductive plate 1, but specifically, said insulative sticky tape 7 can be affixed to the conductive plate 1 after the components (includes the first electric conductors 4 and the second electric conductors 5) are soldered to the conductive plate 1, that is, the operation order of the steps shown in FIG. 28 and FIG. 29 can be exchanged.

Figure 31:
FIG. 31 is a perspective view of a conductive plate of the sixth embodiment of the manufacture method of the light strip before processed.
Figure 32:
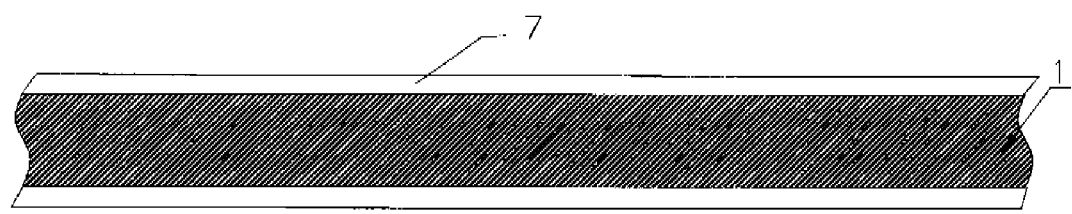
FIG. 32 is a perspective view of the conductive plate shown in FIG. 31 after affixed insulative sticky tape which full covering the conductive plate.
Figure 33:
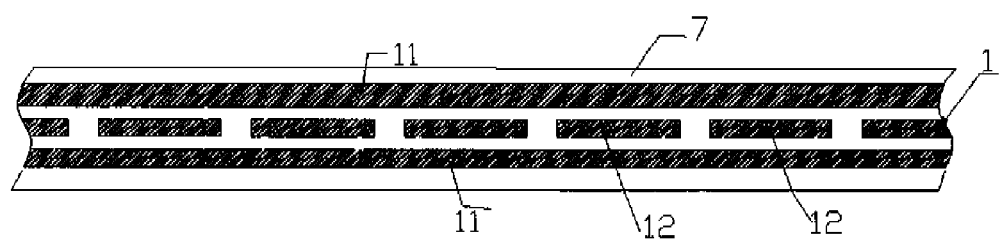
FIG. 33 is a perspective view of the conductive plate shown in FIG. 32 after processed.

FIGS. 31 to 34 are shown the sixth embodiment of the method for making the light strip, with reference to FIGS. 31 to 34, this embodiment disclose how to make a light strip including two main power lines and one light strings. Specifically, the method comprising:

First, referring to FIG. 31, offering a conductive plate 1;

Further, referring to FIG. 32, before processing said conductive plate 1, affixing insulative sticky tape 7 on one surface of said conductive plate 1 for a complete coverage;

Further, referring to FIG. 33, processing said conductive plate 1 to defining two first conductive strips 11 extending longitudinally which serve as main power lines, one column second conductive strips 12 which are certain distance apart one another in the longitudinal direction. Referring to FIG. 33, the first conductive strips 11 and the second conductive strips 12 are stick on the insulative sticky tape 7 after processing said conductive plate 1. The method for processing said conductive plate 1 includes mould punching, etching or laser machining.

Figure 34:
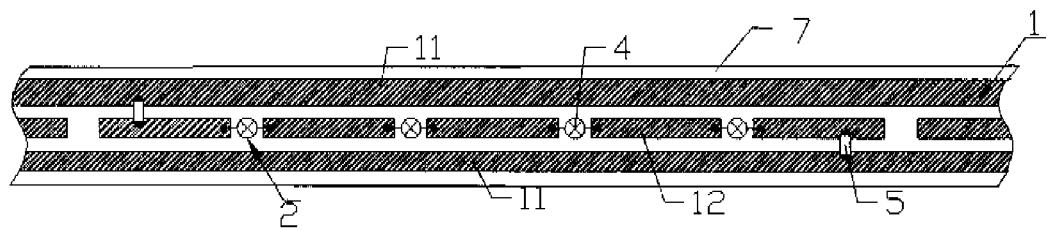
FIG. 34 is a perspective view of the conductive plate shown in FIG. 33 after soldered electronic conductors.

Further, referring to FIG. 34, soldering first electric conductors 4 at said distance between said second conductive strips 12 for forming light strings. As well as, soldering second electric conductors 5 between said first conductive strips 11 and said second conductive strips 12 so as to forming the electrical connection between said light strings and said main power lines. Advantageously, said first electric conductors 4 include light sources which are prerequisite, resistors, capacitors, semiconductors and non-electronic components. In addition, said first electric conductors 4 are direct insert conductors or surface-mounted-device conductors, said light sources include light emitting diode (LED) which here could be direct plug-in LED, surface-mounted-device LED, printed circuit boards with surface-mounted-device LED, or printed circuit boards with LED crystal plates. In addition, said second electric conductors 5 are direct insert conductors or surface-mounted-device conductors such as resistors, capacitors, semiconductors and non-electronic components.

In addition, set holes (which not shown in FIG. 10) on said first conductive strips 11 and said second conductive strips 12 for receiving the plugs of said first electric conductors 4 and/or said second electric conductors 5 when said first electric conductors 4 and said second electric conductors 5 are direct insert conductors.

In this embodiment, because said insulative sticky tape 7 are affixed to said conductive plate 1 before said conductive plate 1 is processed, so said insulative sticky tape 7 can control the location of said main power lines and said light strings changeless during the manufacturing process and after said manufacturing process.

The method for making light strip of the present invention, making a light strip through processing one piece of conductive plate and soldering components on which to integrate the main power lines with the light string to meet the request of fully mechanized and fully automated, and to make said light strip has a simple structure and good stability. The second electric conductors provide electrical connections between the light strings and the main power lines, as well as fix the main power lines and the light strings for ensuring the stability. In addition, the insulative sticky tape is overall covered onto the conductive plate, so as to fix the main power lines and the light string.

Figure 35:
FIG. 35 is a perspective view of a conductive plate of the seventh embodiment of the manufacture method of the light strip before processed.
Figure 36:
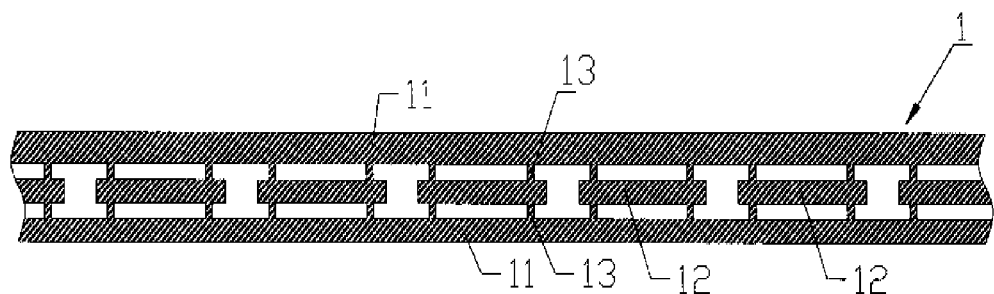
FIG. 36 is a perspective view of the conductive plate shown in FIG. 35 after processed.

FIGS. 35 to 39 are shown the seventh embodiment of the method for making the light strip, with reference to FIGS. 35 to 39, this embodiment disclose how to make a light strip including two main power lines and one light strings. Specifically, the method comprising:

First, referring to FIG. 35, offering a conductive plate 1;

Further, referring to FIG. 36, processing said conductive plate 1 to defining two first conductive strips 11 extending longitudinally which serve as main power lines, one column second conductive strips 12 which are certain distance apart one another in the longitudinal direction, and a plurality of third conductive strips 13 which retained on said conductive plate 1 for connecting said first and second conductive strips. Advantageously, the method for processing said conductive plate 1 includes mould punching, etching or laser machining.

Figure 37:
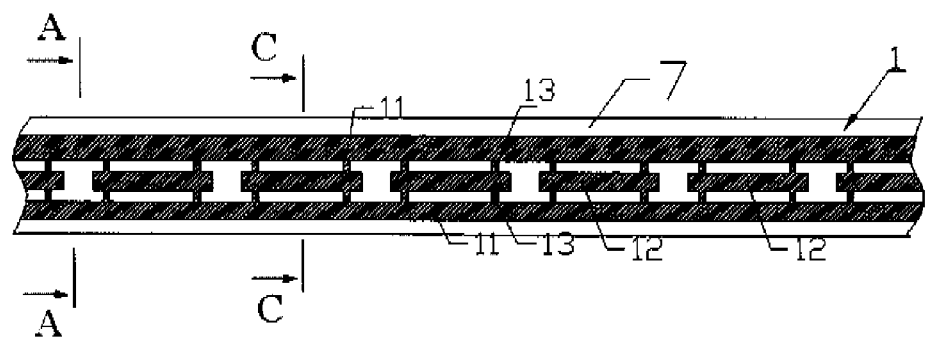
FIG. 37 is a perspective view of the conductive plate shown in FIG. 36 after affixed insulative sticky tape which full covering the conductive plate.

Further, referring to FIG. 37, affixing insulative sticky tape 7 on one surface of said conductive plate 1 for a complete coverage.

Figure 38:
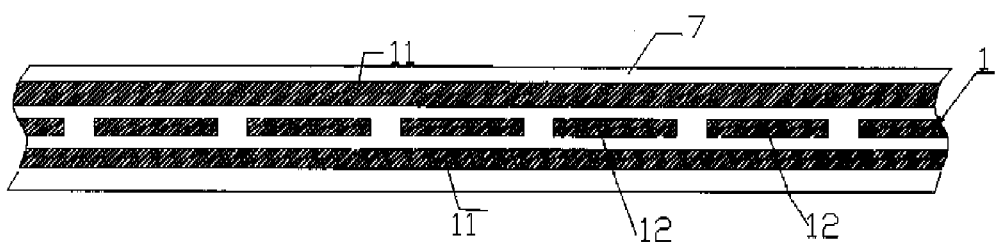
FIG. 38 is a perspective view of the conductive plate shown in FIG. 37 after removing the third conductive strips.

Further, referring to FIG. 38, removing said third conductive strips 13 connected between said first conductive strips 11 and said second conductive strips 12. this embodiment, said third conductive strips 13 are used for fixing the location of said main power lines and said light strings changeless before said insulative sticky tape 7 affixed on the surface of said conductive plate 1, but after that said insulative sticky tape 7 replace said third conductive strips 13 to fix said main power lines and said light strings.

Figure 39:
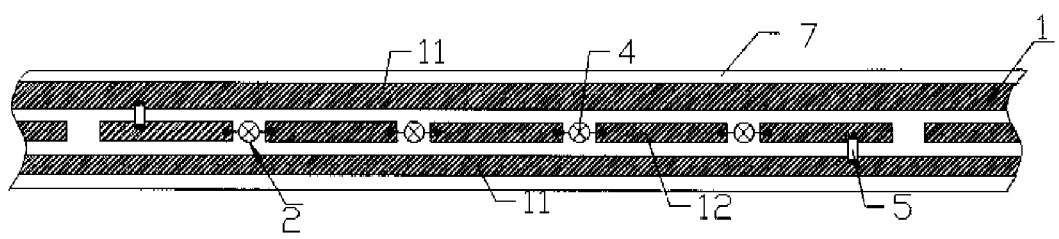
FIG. 39 is a perspective view of the conductive plate shown in FIG. 38 after soldered electronic conductors.

Further, referring to FIG. 39, after removing said third conductive strips 13, soldering said first electric conductors 4 and said second electric conductors 5, as the way to solder said first electric conductors 4 and said second electric conductors 5 is the same as which in the embodiments mentioned above, so there is no need to descript again.

The method for making light strip of the present invention, making a light strip through processing one piece of conductive plate and soldering components on which to integrate the main power lines with the light string to meet the request of fully mechanized and fully automated, and to make said light strip has a simple structure and good stability. The second electric conductors provide electrical connections between the light strings and the main power lines, as well as fix the main power lines and the light strings for ensuring the stability. In addition, the insulative sticky tape is overall covered onto the conductive plate, so as to fix the main power lines and the light string.

The embodiments list above shows the light strip has two three or four main power lines, In specific implementation, the light strip could includes more main power lines cause the disclosure above is only examples.

It is be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for making a light strip, comprising:
    offering a conductive plate;
    processing said conductive plate to defining at least two first conductive strips extending longitudinally which serve as main power lines, at least one column second conductive strips which are certain distance apart one another in the longitudinal direction, and a plurality of third conductive strips retained on said conductive plate for connecting said first and second conductive strips;
    soldering first electric conductors including light sources at said distance between said second conductive strips for forming light strings;
    soldering second electric conductors between said first conductive strips and said second conductive strips so as to form an electrical connection between said light strings and said main power lines; and
    removing said third conductive strips connected between said first conductive strips and said second conductive strips, before removing said third conductive strips connected between said first conductive strips and said second conductive strips, further comprising:
    affixing an insulative sticky tape on one surface of said conductive plate for a complete coverage before soldering said first electric conductors and said second electric conductors; or
    affixing insulative sticky tapes on parts of one surface of said conductive plate each of which is affixed onto said first conductive strips and said second conductive strips before soldering said first electric conductors and said second electric conductors.

2. The method as claimed in claim 1, wherein,
    said first conductors are direct insert conductors or surface-mounted-device conductors;
    said second conductors are direct insert conductors or surface-mounted-device conductors.

3. The method as claimed in claim 2, before removing said third conductive strips connected between said first conductive strips and said second conductive strips, further comprising:
    soldering insulative connectors between said first conductive strips and said second conductive strips for connecting and fixing said first conductive strips and said second conductive strips.

4. The method as claimed in claim 1, wherein, said first electric conductors and/or said second electric conductors are direct insert conductors, said method further comprises:

after affixing said insulative sticky tape on said conductive plate, defining the first holes in said first conductive strips and said second conductive strips for receiving plugs of said conductors, and defining the second holes in said insulative sticky tape when said insulative sticky tape covering said first holes.

5. The method as claimed in claim 2, before removing said third conductive strips connected between said first conductive strips and said second conductive strips, further comprising:

after soldering said first electric conductors and said second electric conductors, affixing an insulative sticky tape on one surface of said conductive plate which is opposite of the surface where said first electric conductors and said second electric conductors being soldered for a complete coverage; or after soldering said first electric conductors and said second electric conductors, affixing insulative sticky tapes on parts of one surface of said conductive plate which is the same or opposite of the surface where the first electric conductors and said second electric conductors being soldered, each of which affixed onto said first conductive strips and said second conductive strips.

6. The method as claimed in claim 1, said removing said third conductive strips connected between said first conductive strips and said second conductive strips further comprising:

retaining the third conductive strips for electrically connecting said first conductive strips and said second conductive strips on said conductive plate; and then removing other third conductive strips.

7. The method as claimed in claim 1, after removing said third conductive strips connected between said first conductive strips and said second conductive strips, further comprising:

coating a plastic insulative layer around said conductive plate through extruding molding.

8. The method as claimed in claim 1, wherein, said processing said conductive plate includes mould, punching, etching or laser machining.

9. The method as claimed in claim 1, wherein, said removing said third conductive strips connected between said first conductive strips and said second conductive strips includes mould punching, etching or laser machining.

10. The method as claimed in claim 1, wherein, said first electric conductors are selected from the group of resistors, capacitors, semiconductors and non-electronic components.

11. The method as claimed in claim 1, wherein, said second electric conductors are selected from the group of resistors, capacitors, semiconductor and non-electronic components.

* * * * *